(12) United States Patent
Yao et al.

(10) Patent No.: US 7,928,508 B2
(45) Date of Patent: Apr. 19, 2011

(54) DISCONNECTED DPW STRUCTURES FOR IMPROVING ON-STATE PERFORMANCE OF MOS DEVICES

(75) Inventors: Chih-Wen (Albert) Yao, Hsin-Chu (TW); Puo-Yu Chiang, Su-ao Township (TW); Tsai Chun Lin, Hsin-Chu (TW); Tsung-Yi Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 95 days.

(21) Appl. No.: 12/103,524

(22) Filed: Apr. 15, 2008

(65) Prior Publication Data

US 2009/0256200 A1    Oct. 15, 2009

(51) Int. Cl.
*H01L 29/66* (2006.01)
(52) U.S. Cl. ............................ 257/342; 257/E29.268
(58) Field of Classification Search .................. 257/327, 257/335, 341, 342, 492, 493, E29.027, E29.197, 257/E29.256, E29.258, E29.268
See application file for complete search history.

(56) References Cited

U.S. PATENT DOCUMENTS

| 6,168,983 B1 | 1/2001 | Rumennik et al. |
| 6,207,994 B1 | 3/2001 | Rumennik et al. |
| 2005/0073007 A1* | 4/2005 | Chen et al. .................... 257/355 |

FOREIGN PATENT DOCUMENTS

WO    WO 9820562 A1    5/1998

* cited by examiner

*Primary Examiner* — Minh-Loan T Tran
*Assistant Examiner* — Vongsavanh Sengdara
(74) *Attorney, Agent, or Firm* — Slater & Matsil, L.L.P.

(57) ABSTRACT

A semiconductor structure includes a semiconductor substrate; a first high-voltage well (HVW) region of a first conductivity type overlying the semiconductor substrate; a second HVW region of a second conductivity type opposite the first conductivity type overlying the substrate and laterally adjoining the first HVW region; a gate dielectric extending from over the first HVW region to over the second HVW region; a gate electrode on the gate dielectric; a drain region in the second HVW region; a source region at an opposite side of the gate dielectric than the drain region; and a deep well region of the first conductivity type underlying the second HVW region. Substantially no deep well region is formed directly underlying the drain region.

20 Claims, 11 Drawing Sheets

DISCONNECTED DPW STRUCTURES FOR IMPROVING ON-STATE PERFORMANCE OF MOS DEVICES

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, AC/DC converters, etc.

There are a variety of forms of HVMOS devices. A symmetric HVMOS device may have a symmetric structure on the source side and drain side. High voltages can be applied on both drain and source sides. An asymmetric HVMOS device may have asymmetric structures on the source side and drain side. For example, only one of the source side and drain side, typically the drain side, is designed for sustaining high voltages.

Figure 1:
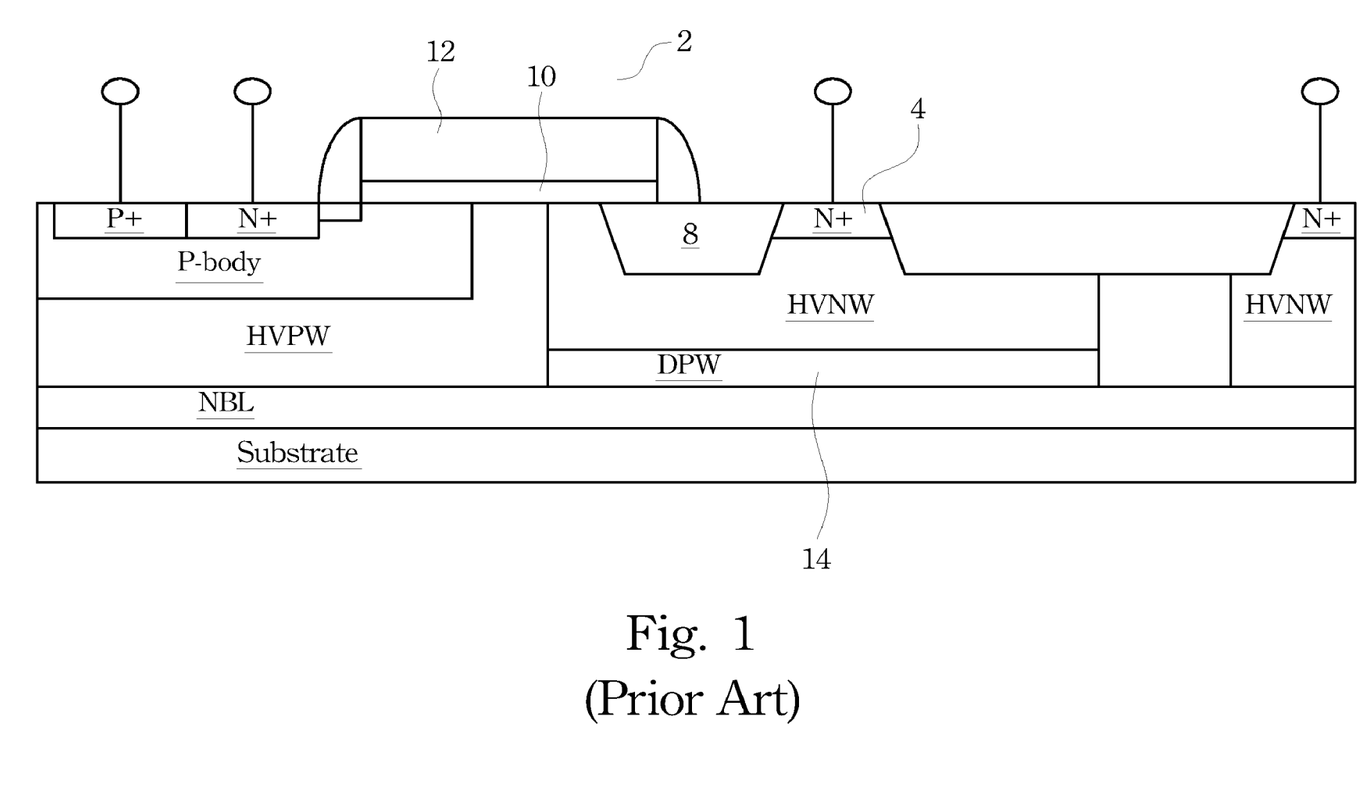
FIG. 1 illustrates a cross-sectional view of a conventional high-voltage n-type MOS (HVNMOS) device.

FIG. 1 illustrates a conventional asymmetric HVNMOS device 2, which includes gate oxide 10, gate electrode 12 on gate oxide 10, drain (contact) region 4 in a high-voltage n-well (HVNW) region, and a source (contact) region 6 in a high-voltage p-well (HVPW) region. A shallow trench isolation (STI) region 8 spaces drain region 4 and gate electrode 12 apart so that a high drain-to-gate voltage can be applied. The HVNW region is formed on deep p-well (DPW) region 14.

Figure 2:
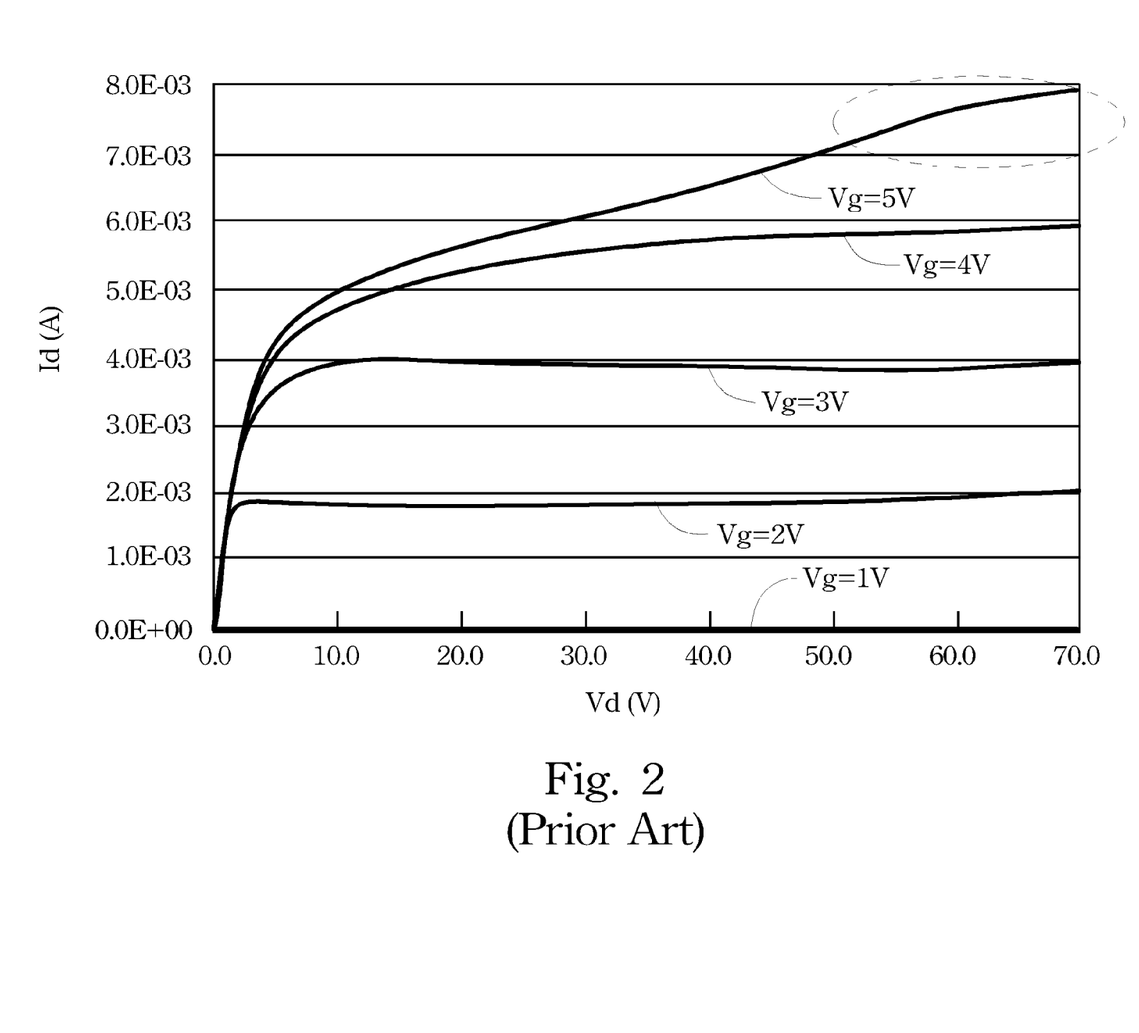
FIG. 2 illustrates an I-V curve of the HVNMOS device shown in FIG. 1.

HVNMOS device 2 suffers from drawbacks, however. FIG. 2 illustrates an I-V curve obtained from HVNMOS device 2, wherein the X-axis represents voltages Vd applied on drain region 4, and the Y-axis represents drive currents Id. It is noted that when operated in high-drain-current regions, for example, when high drain voltages Vd (about 50 volts or greater) and high gate voltages (about 5 volts or greater), are applied, the drive currents do not saturate with the increase in drain voltages, and an extra hump appears as in the dotted circle. This indicates an output resistance problem, which will cause the degradation in device reliability. Further, the existing SPICE models cannot simulate such a device behavior. Therefore, a solution for the above-discussed problem is needed.

SUMMARY OF THE INVENTION

In accordance with one aspect of the present invention, a semiconductor structure includes a semiconductor substrate; a first high-voltage well (HVW) region of a first conductivity type overlying the semiconductor substrate; a second HVW region of a second conductivity type opposite the first conductivity type overlying the semiconductor substrate and laterally adjoining the first HVW region; a gate dielectric extending from over the first HVW region to over the second HVW region; a gate electrode on the gate dielectric; a drain region in the second HVW region; a source region at an opposite side of the gate dielectric than the drain region; and a deep well region of the first conductivity type underlying the second HVW region. Substantially no deep well region is formed directly underlying the drain region.

In accordance with another aspect of the present invention, a semiconductor structure includes a semiconductor substrate; a high-voltage p-well (HVPW) region overlying the semiconductor substrate; a high-voltage n-well (HVNW) region overlying the semiconductor substrate, wherein the HVPW and the HVNW regions laterally contact each other and form an interface; an insulation region extending from a top surface of the HVNW region into the HVNW region; a gate dielectric extending from over the HVPW region to over the insulation region; a gate electrode on the gate dielectric; a source region in the HVPW region; a drain region in the HVNW region, wherein the source and drain regions are heavily doped an n-type impurity; and a deep p-well region including a first portion and a second portion horizontally spaced apart from each other. The first and the second portions are both underlying the HVNW region.

In accordance with yet another aspect of the present invention, a semiconductor structure includes a semiconductor substrate; a HVPW region overlying the semiconductor substrate; a HVNW region overlying the semiconductor substrate, wherein the HVPW and the HVNW regions are in contact with each other and form an interface therebetween; an insulation region extending from a top surface of the HVNW region into the HVNW region; a gate dielectric extending from over the HVPW region to over the insulation region; a gate electrode on the gate dielectric; a source region in the HVPW region; and a drain region in the HVNW region. The source and drain regions are heavily doped n-type regions. The drain region has an inner edge adjoining the insulation region, and an outer edge away from the insulation region. The semiconductor structure further includes a deep p-well region underlying the HVNW region. The deep p-well region has an inner edge and an outer edge, wherein the inner edge and the outer edge of the first deep p-well region are horizontally between the interface and the inner edge of the drain region.

The advantageous features of the present invention include reduced source-drain on-state resistance and improved on-state drive current performance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A high-voltage metal-oxide-semiconductor (HVMOS) embodiment is described with reference to FIGS. 3 through 10, and variations of the preferred embodiments are then discussed. Throughout the various views and illustrative embodiments of the present invention, like reference numbers are used to designate like elements.

Figure 3:
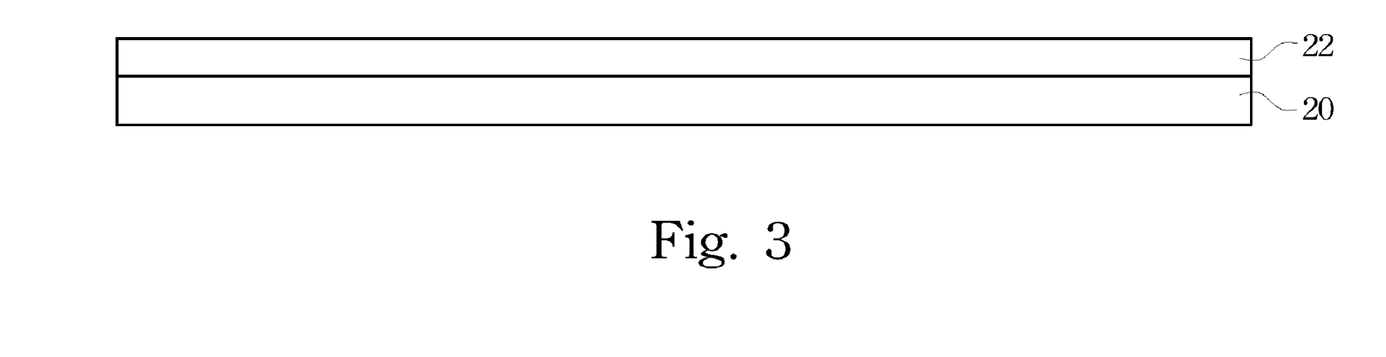
FIGS. 3 through 10 are cross-sectional views of intermediate stages in the manufacturing of a HVNMOS device.

Referring to FIG. 3, substrate 20 is provided. Substrate 20 is preferably formed of a semiconductor material such as silicon, or other commonly used semiconductor materials such as SiGe and/or other group III, group IV, and/or group V elements. Preferably, substrate 20 is lightly doped with a p-type impurity, although it can also be doped with an n-type impurity.

An implantation is performed to substrate 20, forming n-type buried layer (NBL) 22. In an exemplary embodiment, phosphorous, antimony, and/or arsenic may be implanted. Alternatively, NBL 22 may be formed by diffusing an n-type impurity into substrate 20 at an elevated temperature.

Figure 4:
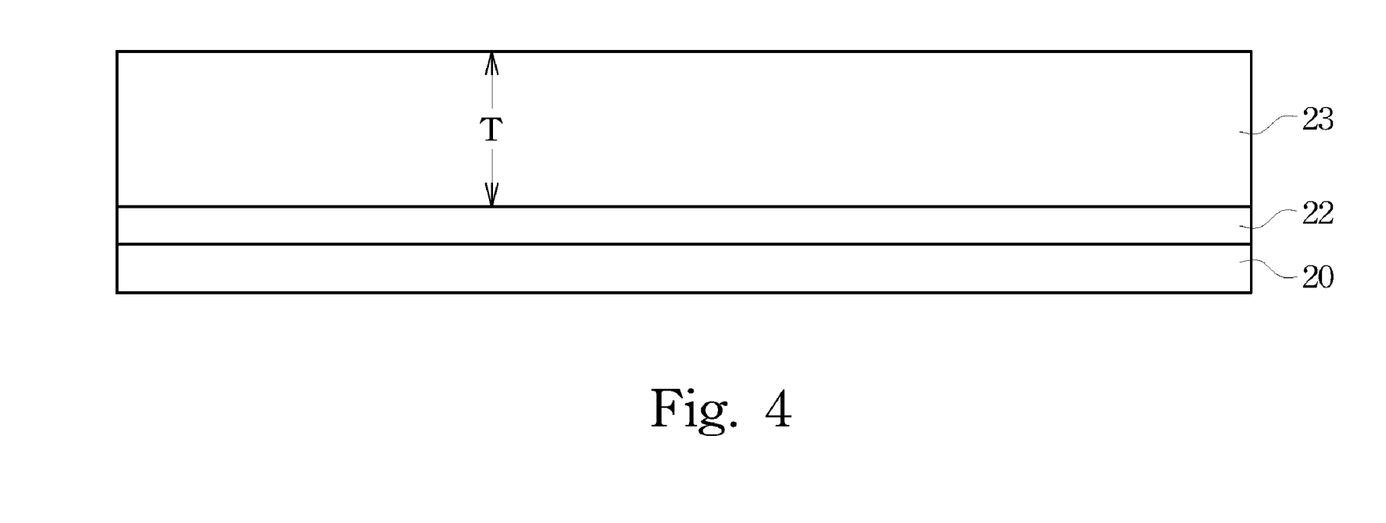

FIG. 4 illustrates the epitaxial growth of epitaxial layer 23 on NBL 22. Epitaxial layer 23 is preferably formed of a semiconductor material such as silicon, and can be the same as, or different from, the material of substrate 20. Epitaxial layer 23 may either be un-doped, or lightly doped with a p-type or n-type impurity, which is preferably in-situ doped while the epitaxial growth proceeds. In an exemplary embodiment, epitaxial layer 23 is doped with an n-type impurity, such as phosphorous, antimony and/or arsenic, with the concentration equal to the desirable concentration of the subsequently formed high-voltage n-well region (HVNW) 28 (refer to FIG. 5). For example, the concentration may be between about $10^{14}/cm^3$ and about $10^{17}/cm^3$. The thickness T of epitaxial layer 23 is preferably equal to the desirable thickness of the subsequently formed high voltage p-type and n-type well regions. In an exemplary embodiment, thickness T is greater than about 2 nm. In other embodiments, epitaxial layer 23 is doped with a p-type impurity.

Figure 5:
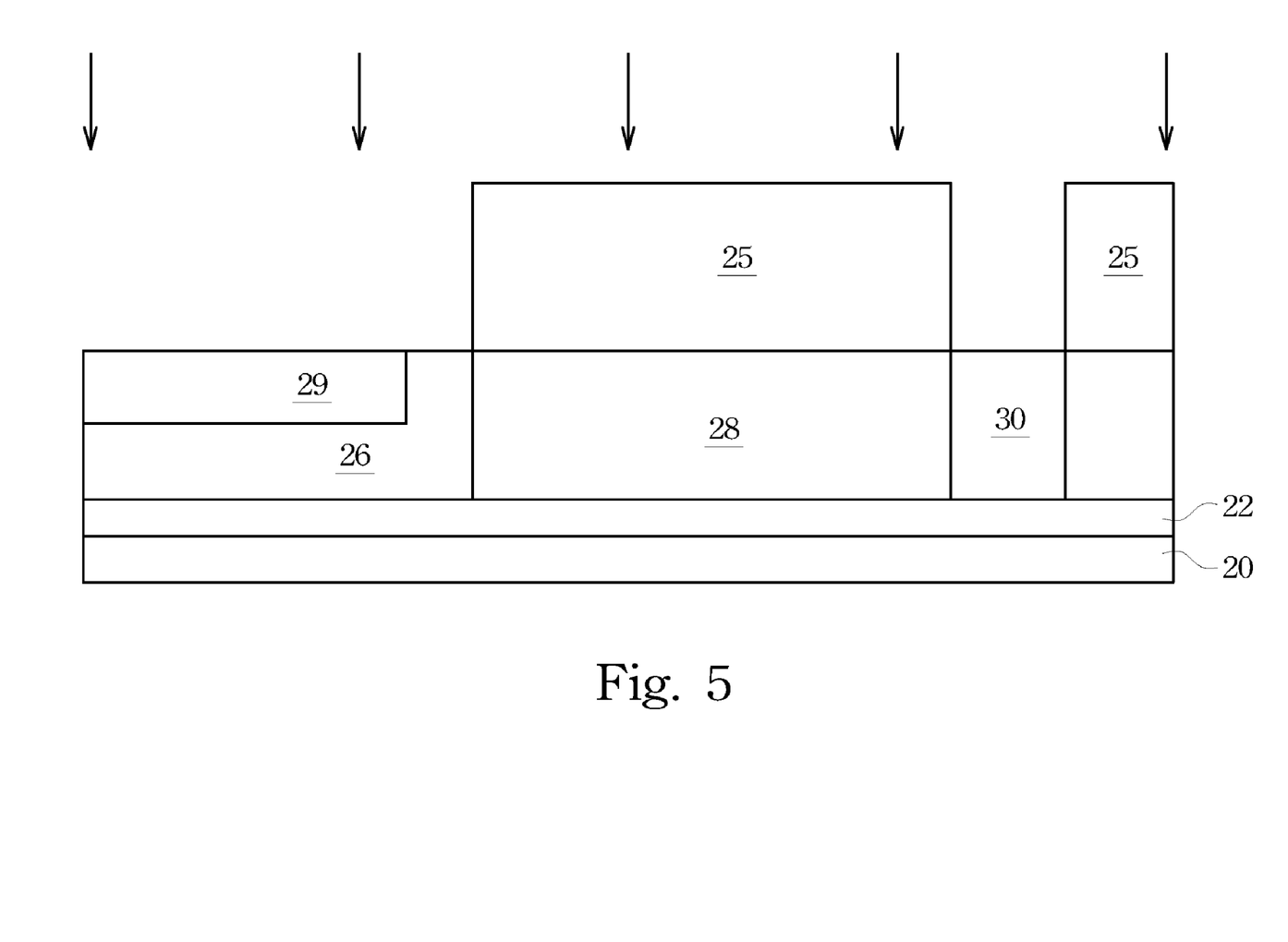

FIG. 5 illustrates the formation of high-voltage p-well (HVPW) regions 26 and 30, and HVNW region 28 in epitaxial layer 23. Photoresist 25 is formed to cover regions where HVNW regions are to be formed, while the future HVPW regions are exposed. An implantation is then performed to introduce a p-type impurity, such as boron, indium, and the like, forming HVPW regions 26 and 30. The n-type impurity in the doped epitaxial layer 23 is neutralized by the implanted p-type impurity, with the net concentration in implanted regions 26 and 30 being of p-type. In an exemplary embodiment, the p-type impurity concentration in HVPW regions 26 and 30 is between about $10^{14}/cm^3$ to about $10^{17}/cm^3$, although the impurity concentration may be higher or lower. Please note that although HVPW regions 26 and 30 may be two separate regions, they can also be portions of a continuous HVPW ring encircling HVNW region 28, if shown in a top view. Regions masked by photoresist 25 become HVNW regions, including HVNW region 28. After the formation of regions 26, 28, and 30, photoresist 25 is removed.

Optionally, floating body 29 is formed by an implantation with the help of an additional photoresist (not shown). Floating body 29 is of p-type, and may have an impurity concentration higher than the impurity concentration of HVPW 26.

Figure 6:
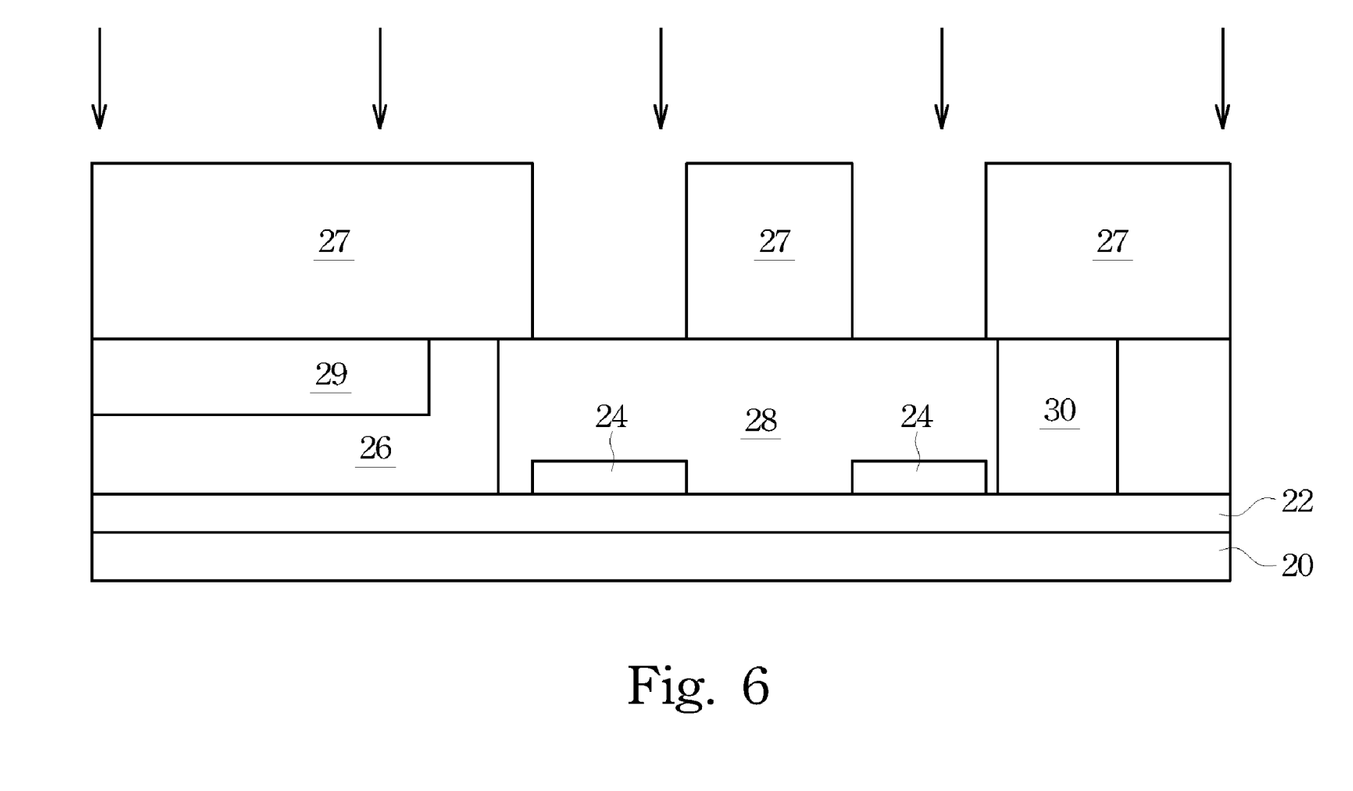

Referring to FIG. 6, photoresist 27 is formed and patterned using lithography techniques. Deep p-well (DPW) regions 24 are formed by implanting a p-type impurity, such as boron, indium, and the like. The p-type impurity concentration in DPW regions 24 may be in a same order as, or higher than, the p-type impurity concentration in HVNW region 28. In an exemplary embodiment, the p-type impurity concentration in DPW regions 24 is between about $1E15/cm^3$ to about $1E17/cm^3$. The desirable locations of DPW regions 24 are discussed in detail in subsequent paragraphs. The energy for forming DPW regions 24 is preferably high enough, so that DPW regions 24 are at the bottom of HVNW region 28. More preferably, DPW regions 24 are in contact with NBL 22.

In other embodiments, epitaxial layer 23 (refer to FIG. 4) is not doped, and HVPW regions 26 and 30, HVNW region 28, and DPW regions 24 are all formed by implantations, wherein the depths of these regions are controlled by using appropriate energies.

Figure 7:
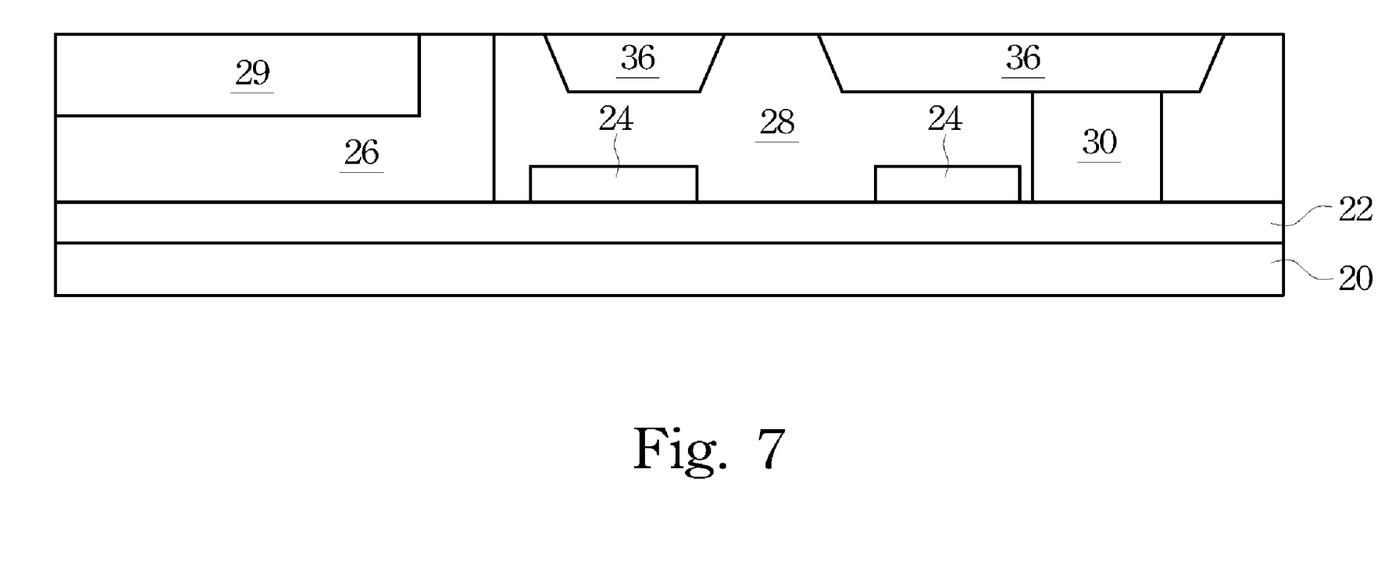

FIG. 7 illustrates the formation of insulation regions 36. In the preferred embodiment, as is shown in FIG. 7, insulation regions 36 are formed by forming trenches in HVNW region 28 and HVPW region 30, filling the trenches with a dielectric material, such as $SiO_2$ or high-density plasma (HDP) oxide, and performing a chemical mechanical polish to level the surface of the filled dielectric material to top surfaces of regions 26, 28, and 30. The resulting shallow trench isolation (STI) regions are insulation regions 36. In other embodiments, the insulation regions are field oxides. An exemplary formation process includes forming a mask layer, preferably comprising SiN, over HVPW region 26 and 30 and HVNW region 28. The mask layer is then patterned to form openings. A local oxidation is then performed, and insulation regions (field oxides) 36 are formed in the openings. The mask layer is then removed.

In the above-discussed embodiments, insulation regions 36 are shown as being formed after the formation of well regions 26, 28, and 30. One skilled in the art will realize different orders can be used. For example, in alternative embodiments, after the formation of epitaxial layer 23, insulation regions 36 are formed, followed by the formation of well regions 26, 28, and 30. DPW regions 24 may be formed before, or after, the formation of insulation regions 36, and/or the formation of well regions 26, 28, and 30.

Figure 8:
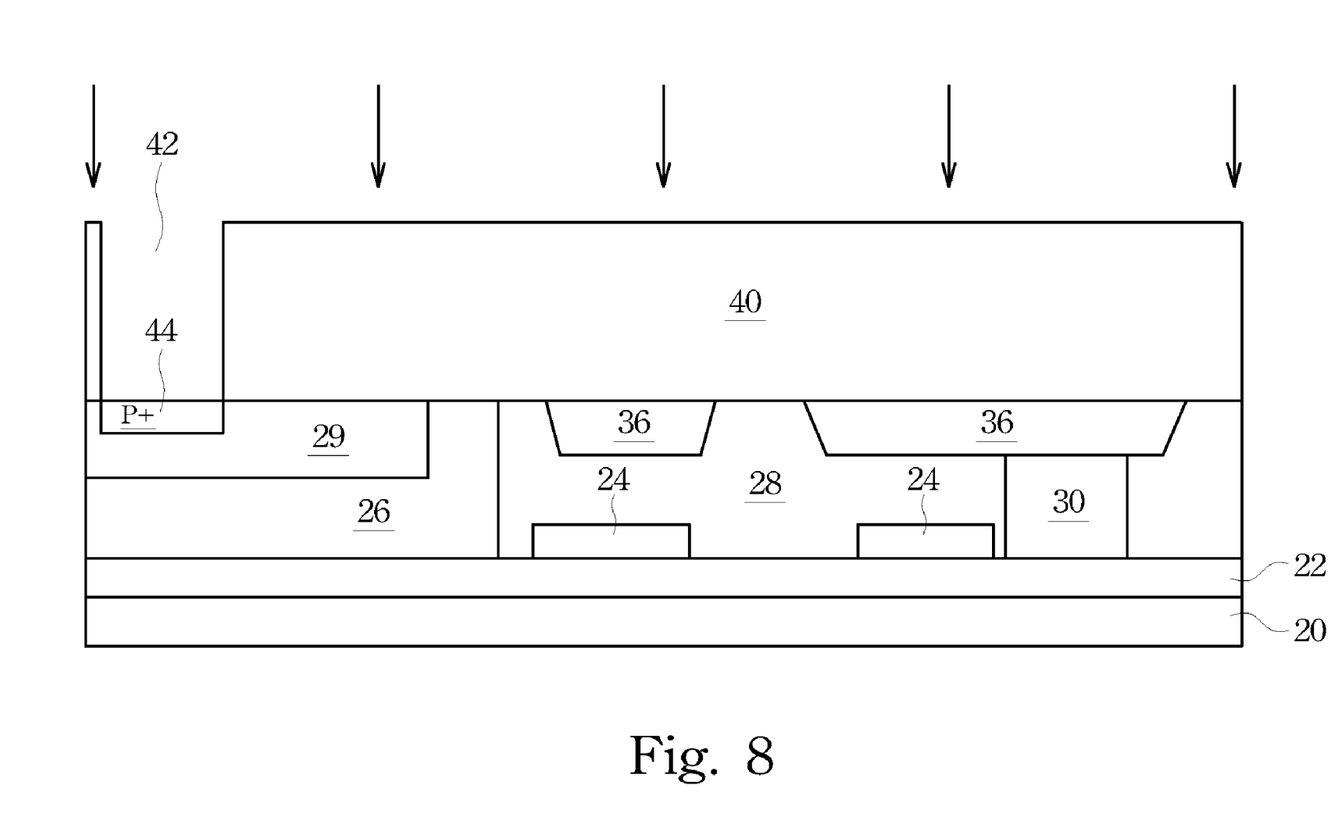

Referring to FIG. 8, photoresist 40 is applied and patterned, forming opening 42. A p-type dopant implantation is performed, forming P+ region 44 in HVPW region 26 (or floating body 29). Preferably, P+ region 44 comprises boron and/or other p-type dopants, and is heavily doped to a concentration of greater than about $10^{20}/cm^3$. P+ region 44 acts as the contact region of HVPW region 26. Photoresist 40 is then removed.

Figure 9:
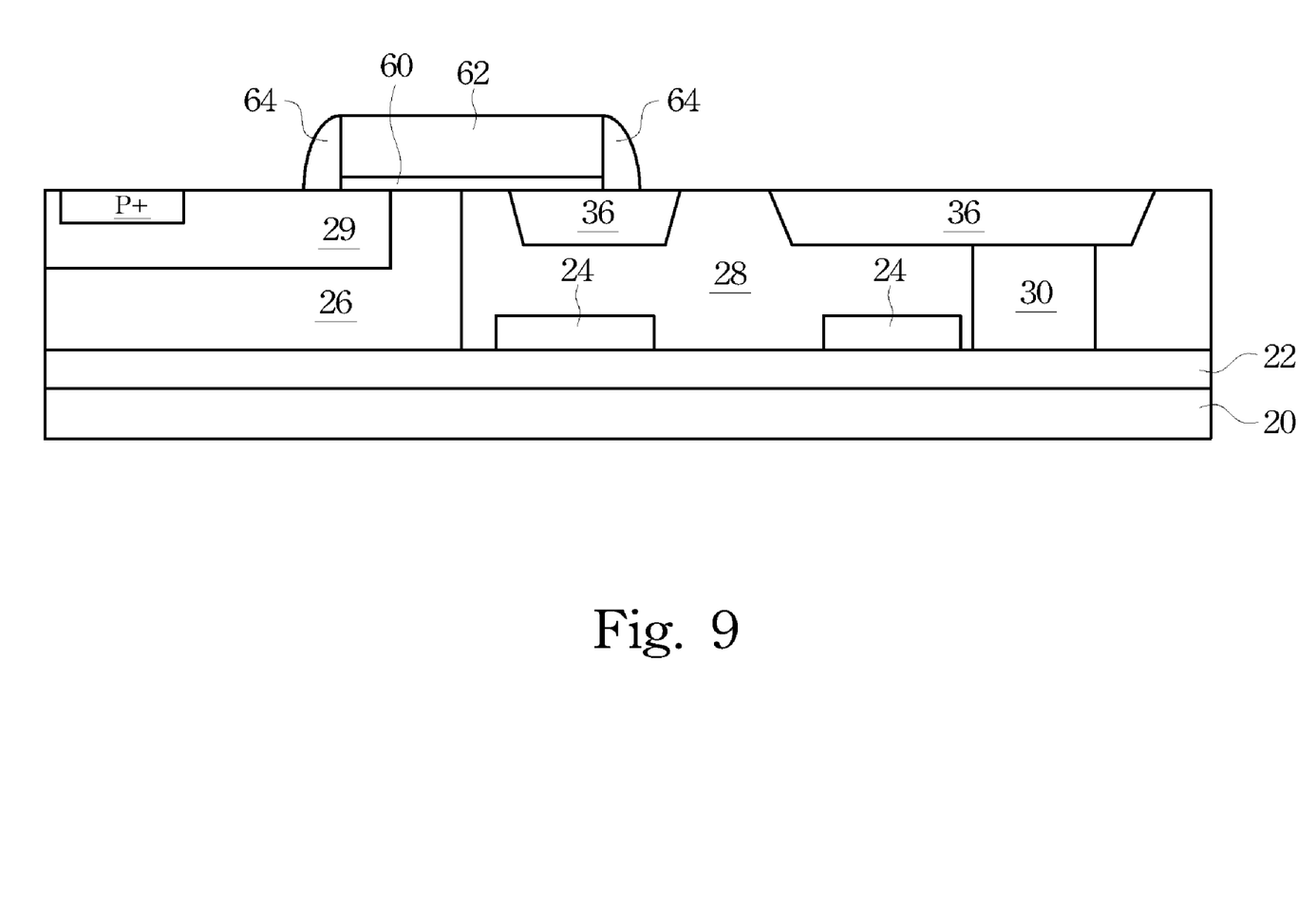

FIG. 9 illustrates the formation of gate dielectric 60, gate electrode 62, and spacers 64. As is known in the art, gate dielectric 60 preferably includes silicon oxide, although other dielectric materials such as silicon nitride, silicon carbide, silicon oxynitride, high-k materials, combinations thereof, and multi-layers thereof, can be used. Gate electrode 62 preferably includes doped polysilicon. Alternatively, metals, metal nitrides, metal silicides, and other conductive materials can be used. Gate spacers 64 are preferably formed by blanket forming a dielectric material, and removing undesirable portions from horizontal surfaces. The details of forming gate dielectric 60, gate electrode 62, and gate spacers 64 are well known in the art, and thus are not repeated herein. Preferably, gate dielectric 60 and gate electrode 62 extend from over HVPW region 26 to over HVNW region 28, and a side edge of gate electrode 62 may be directly over the insulation region 36 in HVNW region 28. A lightly doped source region (not shown) may be formed in HVPW region 26, and may be implanted using gate electrode 62 as a mask.

Figure 10:
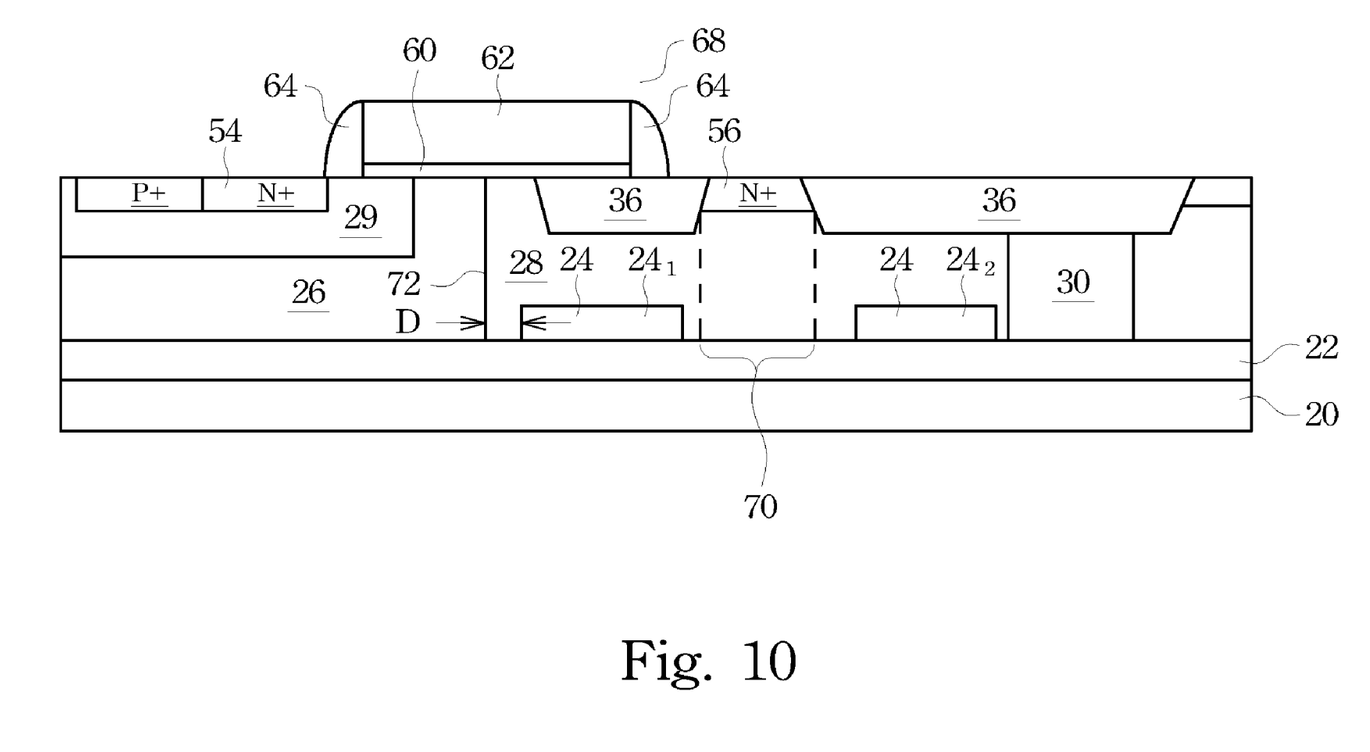

Referring to FIG. 10, a photoresist (not shown) is formed and patterned. An n-type impurity implantation is performed, forming N+ region 54 in HVPW region 26 and N+ region 56 in HVNW region 28. HVNMOS device 68 is thus formed. The N+ dopant may comprise phosphorus and/or arsenic. Preferably, the n-type dopant is heavily doped to a concentration of greater than about $10^{20}/cm^3$. In the described embodiments, heavily doped means an impurity concentration of above about $10^{20}/cm^3$, depending upon the specific device type, technology generation, minimum feature size, and the like. N+ region 54 acts as the source region of the resulting HVNMOS device 68, while N+ region 56 acts as the drain region. After the implantation, the photoresist is removed. Since gate electrode 62 is spaced apart from N+ region 56, a high gate-drain voltage can be applied.

In alternative embodiments, floating body 29, gate dielectric 60, gate electrode 62, and gate spacers 64 are formed after the formation of STI region 36, but before the formation of P+ pickup region 44 and N+ regions 54 and 56. N+ regions 54 and 56 may also be formed before the formation of gate dielectric 60, gate electrode 62 and gate spacers 64. One skilled in the art will realize the respective process steps.

In the structure as shown in FIG. 10, DPW regions 24 are separated into two disconnected portions $24_1$ and $24_2$, with no DPW region formed directly underlying drain region 56. Each of portions $24_1$ and $24_2$, is directly under a portion of HVNW region 28. Further, the top surface of each of portions $24_1$ and $24_2$ contacts the bottom surfaces of the respective overlying portions of HVNW region 28. If the region directly underlying drain region 56 is denoted as region 70, and HVNW region 28 and HVPW region 26 have an interface 72, then DPW region(s) 24 may be formed on the side of region 70 closer to the interface 72, or the side of region 70 away from interface 72. Each of DPW portions $24_1$ and $24_2$ may have a pair of edges (the illustrated left side edge and right side edge) substantially parallel to interface 72. One of the edges in each pair may be aligned to the inner edge and the outer edge of drain region 56, as is shown as doped lines, or spaced apart from region 70, as is shown in FIG. 10.

Although only two DPW regions 24 are illustrated, DPW regions 24 may include different number of disconnected portions. In a first embodiment, only the DPW region $24_1$, which is between region 70 and interface 72, is formed, while the DPW portion $24_2$, which is on the opposite side of interface 72, is not formed. In other embodiments, only DPW portion $24_2$ is formed. In yet other embodiments, there are more than two DPW regions 24. For example, each of the illustrated DPW portions $24_1$ and $24_2$ may be divided into two or more discrete DPW regions.

In the preferred embodiment, DPW portion $24_1$ is spaced apart from interface 72. Advantageously, when MOS device 68 is operated at the on-state, this will reduce the RESURF effect (discussed with more detail in subsequent paragraphs), resulting in a reduced drain-to-source resistance Rdson. In an exemplary embodiment, DPW portion $24_1$ is within an overlapping region of gate electrode 62 and HVNW 28.

Figure 11:
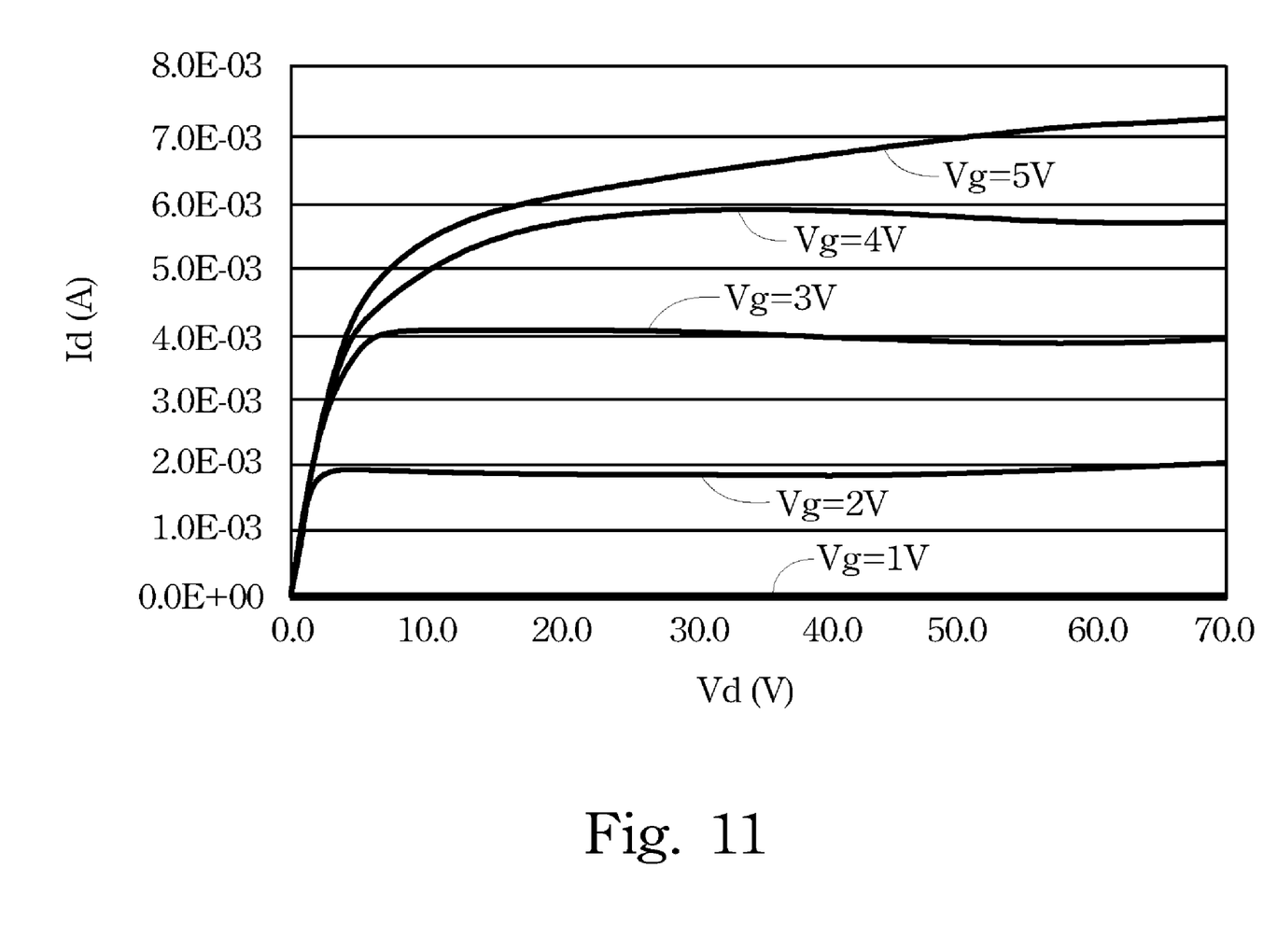
FIG. 11 illustrates an I-V curve of an asymmetric HVNMOS device embodiment of the present invention.

FIG. 11 illustrates $I_d$-$V_d$ characteristics measured from a HVNMOS device embodiment of the present invention. It is noted that when the HVNMOS device is operated with high currents, such as when high drain voltages Vd (about 50 volts or greater) and high gate voltages (about 5 volts or greater) are applied, the drive currents may saturate. This indicates that the reliability of the HVMOS devices formed using the embodiments of the present invention is improved.

The improvement in the I-V curve may be explained as followed. It is noted, however, that the real mechanism may be more complicated. With DPW region 24 formed under HVNW 28, a depletion region is formed between HVNW 28 and DPW region 24. It is expected that when the drain voltage and/or the gate voltage increase, the depletion region grows, and may eventually reach drain region 56. As a result, the so-called reduced surface field (RESURF) effect is enhanced, resulting in a significant increase in impact ionization and hot carriers, and hence the increase in drain current. In the embodiments of the present invention, no DPW region is formed directly under drain region 56, and hence the RESURF effect is weakened, resulting in the reduction in the adverse drain current increase.

Figure 12:
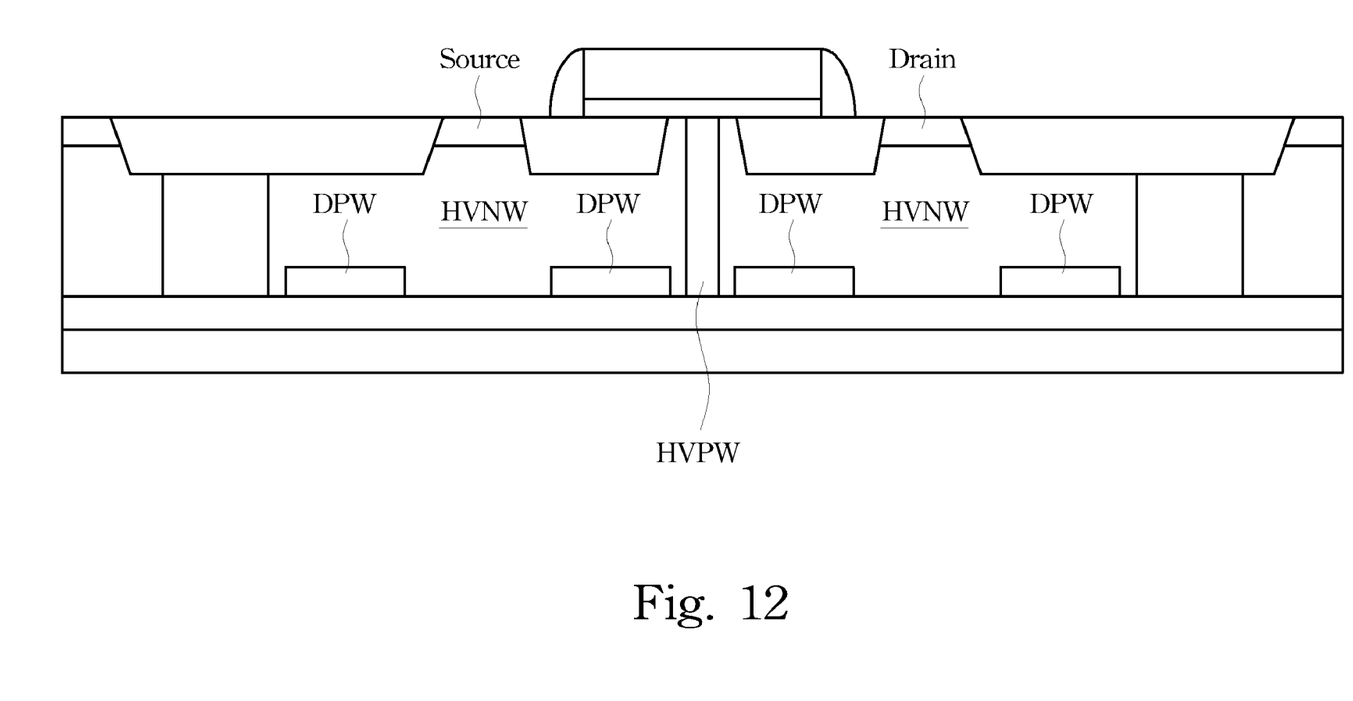
FIG. 12 illustrates a symmetric HVNMOS device embodiment.

The previously illustrated embodiments have asymmetric structures, wherein source and drain regions are in different types of high-voltage well regions. FIG. 12 illustrates a HVNMOS embodiment having a symmetric structure, wherein the HVNMOS device includes two HVNW regions and a HVPW region therebetween. In this case, DPW regions are preferably not formed directly underlying both the source region and the drain region.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate;
   a first high-voltage well (HVW) region of a first conductivity type overlying the semiconductor substrate;
   a second HVW region of a second conductivity type opposite the first conductivity type overlying the semiconductor substrate and laterally adjoining the first HVW region;
   a gate dielectric extending from over the first HVW region to over the second HVW region;
   a gate electrode on the gate dielectric;
   a drain region in the second HVW region;
   a source region on an opposite side of the gate dielectric than the drain region; and
   a deep well region of the first conductivity type directly underlying, and vertically overlapping at least a portion of, the second HVW region, wherein substantially no deep well region is formed directly underlying the drain region.

2. The semiconductor structure of claim 1, wherein the first conductivity type is p-type, and the second conductivity type is n-type.

3. The semiconductor structure of claim 1, wherein the deep well region is spaced apart horizontally from an interface between the first and the second HVW regions.

4. The semiconductor structure of claim 1 further comprising a buried layer of the second conductivity type, wherein the buried layer is overlying the semiconductor substrate and underlying the first HVW region, the second HVW region, and the deep well region.

5. The semiconductor structure of claim 1, wherein the deep well region comprises two separated portions spaced apart by a portion of the second HVW region directly under the drain region.

6. The semiconductor structure of claim 1 further comprising:
- a third HVW region of the second conductivity type on an opposite side of the first HVW region than the second HVW region, wherein the third HVW region has a same thickness as the first HVW region, and wherein the source region is in the third HVW region; and
- an additional deep well region of the first conductivity type underlying the third HVW region, wherein the deep well region and the additional deep well region are at a same level and have a same thickness, and wherein no additional deep well region is formed directly underlying the source region.

7. The semiconductor structure of claim 1, wherein a top surface of the deep well region contacts a bottom surface of the second HVW region.

8. A semiconductor structure comprising:
- a semiconductor substrate;
- a high-voltage p-well (HVPW) region overlying the semiconductor substrate;
- a high-voltage n-well (HVNW) region overlying the semiconductor substrate, wherein the HVPW and the HVNW regions laterally contact each other and form an interface;
- an insulation region extending from a top surface of the HVNW region into the HVNW region;
- a gate dielectric extending from over the HVPW region to over the insulation region;
- a gate electrode on the gate dielectric;
- a source region in the HVPW region;
- a drain region in the HVNW region, wherein the source and the drain regions are heavily doped with an n-type impurity; and
- a deep p-well region comprising a first portion and a second portion horizontally spaced apart from each other, wherein each of the first and the second portions is directly underlying, and vertically overlapping at least a portion of, the HVNW region.

9. The semiconductor structure of claim 8, wherein no deep p-well region is formed directly under the drain region.

10. The semiconductor structure of claim 8, wherein the first portion of the deep p-well region has at least a portion directly under the insulation region, and wherein the first portion is spaced apart from the interface, and wherein the insulation region is a continuous region.

11. The semiconductor structure of claim 8, wherein the first portion of the deep p-well region is substantially vertically aligned to the interface.

12. The semiconductor structure of claim 8 further comprising an additional HVPW region adjoining the HVNW region and on an opposite side of the HVNW region than the HVPW region, wherein the second portion of the deep p-well region is horizontally between the drain region and an additional interface between the HVNW region and the additional HVPW region.

13. The semiconductor structure of claim 8, wherein the first portion and the second portion of the deep p-well region are spaced apart by a portion of the HVNW region.

14. The semiconductor structure of claim 8 further comprising an n-type buried layer (NBL), wherein the NBL is overlying the semiconductor substrate, and underlying the HVPW region, the HVNW region, and the deep p-well region.

15. A semiconductor structure comprising:
- a semiconductor substrate;
- a high-voltage p-well (HVPW) region overlying the semiconductor substrate;
- a high-voltage n-well (HVNW) region overlying the semiconductor substrate, wherein the HVPW and the HVNW regions are in contact with each other and form an interface therebetween;
- an insulation region extending from a top surface of the HVNW region into the HVNW region;
- a gate dielectric extending from over the HVPW region to over the insulation region;
- a gate electrode on the gate dielectric;
- a source region in the HVPW region;
- a drain region in the HVNW region, wherein the source and the drain regions are heavily doped n-type regions, and wherein the drain region has an inner edge adjoining the insulation region, and an outer edge away from the insulation region; and
- a deep p-well region underlying the HVNW region, wherein the deep p-well region has an inner edge and an outer edge substantially parallel to the interface, and wherein the inner edge and the outer edge of the deep p-well region are between the interface and the inner edge of the drain region.

16. The semiconductor structure of claim 15, wherein the inner edge of the deep p-well region is spaced apart from the interface.

17. The semiconductor structure of claim 15, wherein the inner edge of the deep p-well region is vertically aligned to the interface.

18. The semiconductor structure of claim 15 further comprising:
- an additional HVPW region adjoining the HVNW region and on an opposite side of the HVNW region than the HVPW region, wherein the HVNW region and the additional HVPW region form an additional interface therebetween;
- an additional insulation region extending from the HVNW region into the additional HVPW region; and
- an additional deep p-well region horizontally between the outer edge of the drain region and the additional interface, wherein the deep p-well region and the additional deep p-well region are physically separated.

19. The semiconductor structure of claim 18, wherein the additional deep p-well region has an outer edge spaced apart from the additional interface.

20. The semiconductor structure of claim 15 wherein the insulation region is spaced apart from the HVPW region.

* * * * *